(12) United States Patent
Orikabe et al.

(10) Patent No.: US 7,282,257 B2
(45) Date of Patent: Oct. 16, 2007

(54) RESIN COMPOSITION AND ADHESIVE FILM FOR MULTI-LAYERED PRINTING WIRING BOARD

(75) Inventors: Hiroshi Orikabe, Kawasaki (JP); Kenji Kawai, Kawasaki (JP)

(73) Assignee: Ajinomoto Co., Inc., Tokyo (JP)

( * ) Notice: Subject to any disclaimer, the term of this patent is extended or adjusted under 35 U.S.C. 154(b) by 225 days.

(21) Appl. No.: 10/875,278

(22) Filed: Jun. 25, 2004

(65) Prior Publication Data

US 2005/0019554 A1 Jan. 27, 2005

(30) Foreign Application Priority Data

Jun. 27, 2003 (JP) .............................. 2003-183842

(51) Int. Cl.
*B32B 7/02* (2006.01)
(52) U.S. Cl. ...................... 428/216; 428/212; 428/213; 428/214; 428/215; 524/500; 524/538; 156/150; 156/247; 156/252; 156/253; 156/285; 156/307.1; 216/16
(58) Field of Classification Search ................ 524/500, 524/538
See application file for complete search history.

(56) References Cited

U.S. PATENT DOCUMENTS

| | | | |
|---|---|---|---|
| 5,087,658 A * | 2/1992 | Nishizawa et al. .......... 524/538 |
| 5,164,816 A * | 11/1992 | Nishizawa et al. .......... 257/759 |
| 6,297,341 B1 | 10/2001 | Ueki et al. | |
| 6,346,164 B1 * | 2/2002 | Nakamura et al. .......... 156/289 |
| 6,376,053 B1 * | 4/2002 | Nakamura et al. .......... 428/209 |
| 6,613,987 B2 * | 9/2003 | Seki et al. .................. 174/258 |
| 6,703,133 B2 | 3/2004 | Sugo et al. | |
| 6,739,040 B1 * | 5/2004 | Nakamura et al. ............ 29/830 |
| 6,881,293 B2 * | 4/2005 | Nakamura et al. ....... 156/307.1 |
| 2004/0099367 A1 | 5/2004 | Nakamura et al. | |
| 2004/0261941 A1* | 12/2004 | Nakamura et al. .......... 156/289 |

FOREIGN PATENT DOCUMENTS

| | | |
|---|---|---|
| EP | 1 307 077 | 5/2003 |
| JP | 2000-319386 | 11/2000 |
| JP | 2001-123060 | 5/2001 |
| JP | 2002-12667 | 1/2002 |
| WO | WO 01/97582 | 12/2001 |

* cited by examiner

*Primary Examiner*—Bruce H. Hess
*Assistant Examiner*—David J. Joy
(74) *Attorney, Agent, or Firm*—Oblon, Spivak, McClelland, Maier & Neustadt, P.C.

(57) ABSTRACT

The present invention relates to resin compositions that are useful for preparing adhesive films, which are, in turn, useful for forming interlayer insulation layers for multi-layered printed wiring boards having an excellent mechanical strength and capable of being roughened by an oxidizing agent.

16 Claims, No Drawings

RESIN COMPOSITION AND ADHESIVE FILM FOR MULTI-LAYERED PRINTING WIRING BOARD

CROSS REFERENCES TO RELATED APPLICATIONS

This application claims priority to Japanese Patent Application No. 2003/183842, filed on Jun. 27, 2003, and which is incorporated herein by reference in its entirety.

BACKGROUND OF THE INVENTION

1. Field of the Invention

The present invention relates to resin compositions which are useful as interlayer insulation materials for multi-layered printed wiring boards of the build-up type, in which insulation layers and conductive layers in which circuits are formed are alternately layered. The present invention also relates to adhesive films for multi-layered printed wiring board, which contain such said resin compositions. The present invention further relates to multi-layered printed wiring boards in which a cured product of the said resin composition is introduced into the insulation layer and also to methods for the manufacture of such multi-layered printed wiring boards.

2. Discussion of the Background

In recent years, as electronic devices such as portable phones are becoming smaller in size and higher in efficiency, and the build-up layer in multi-layered printed wiring boards is growing to many layers, there has been an increasing demand for a multi-layered printed wiring board having a multi-layered via structure called staggered via or stacked via where via holes are connected to plural build-up insulation layers.

Multi-layered printed wiring boards tend to be more and more multi-layered but, on the other hand, there is a need for achieving a thin form of multi-layered printed wiring board while their mechanical strength is to be still maintained. Prepregs and the like manufactured from glass cloth or the like, in which an epoxy resin is impregnated and which have been used in the conventional circuit substrate, have an excellent mechanical strength but there is a limit for reducing their thickness. There is a known method in which a multi-layered printed wiring board is manufactured using a copper foil to which a heat-resistant resin using a thermoplastic polyimide or the like is adhered. However, since the glass transition point of the heat-resistant resin is too high, the temperature necessary for lamination becomes high and its use for common multi-layered printed wiring board is difficult.

In the meantime, some of the present inventors reported, in International Laid-Open Patent Application No. WO 01/97582, that it is possible to form an insulation layer having an excellent mechanical strength by the use of an adhesive film having a heat-resistant resin layer and a thermosetting resin composition layer.

With regard to the heat-resistant resin used for circuit boards such as a multi-layered printed wiring board, commercially available films such as a polyimide film are generally used and, in order to form a conductive layer on the surface of such a film, it is necessary to carry out a roughening treatment by a dry method such as mechanical sanding or plasma etching. In International Laid-Open Patent Application No. WO 01/97582, the formation of thermosetting resin composition layers on both sides of the heat-resistant resin layer is adopted so that a roughening treatment by an oxidizing agent which is commonly used for the manufacture of multi-layered printed wiring boards by a build-up system and shows higher productivity is able to be applied. Thus, in an adhesive film for multi-layered printed wiring boards as such, the circuit substrate is laminated with a thermosetting resin composition layer on one side which is adjacent to the heat-resistant resin layer while another thermo-setting resin composition layer is roughened by an oxidizing agent whereupon a heat-resistant resin layer having an excellent mechanical strength is introduced together with lamination to the circuit substrate. Further, it is also possible that the thermosetting resin composition layer which is the outermost layer may be roughened by an oxidizing agent and then a conductive layer may be formed by means of metal plating whereupon a multi-layered printed wiring board having an excellent mechanical strength is easily manufactured. On the other hand however, when a three-layered structure, in which a heat-resistant resin layer is placed between the thermosetting resin composition layers, is adopted there is a problem that it is not possible to enhance the mechanical strength near the surface of insulation layer where the conductive layer is formed.

In International Laid-Open Patent Application No. WO 01/97582, as an example of layer constitutions of the adhesive film, there is further disclosed an example of the order of layers in which two layers of a heat-resistant resin layer and a thermosetting resin layer are the main layers. However, on page 17 of International Laid-Open Patent Application No. WO 01/97582, the above-mentioned three-layered structure for the roughening by an oxidizing agent is proposed as being mentioned that the surface of the insulation layer may be easily roughened and a conductive layer is easily formed by metal plating when a thermosetting resin composition layer (layer B) which is able to be roughened by an oxidizing agent is formed on the surface side of the insulation layer and, as a result, a direct roughening of the heat-resistant resin layer by an oxidizing agent is not expected. In addition, on pages 6 to 7, there are disclosures to the effect that heat-resistant resin varnish is applied and dried whereupon a heat-resistant resin layer is formed and that the said resin varnish may be used after kneading with appropriate thermosetting resin and resin additive therewith. However, there is no disclosure of any concrete examples at all.

In commercially available films such as polyimide film used as a heat-resistant resin layer in the Examples of International Laid-Open Patent Application No. WO 01/97582, it is not possible to avoid problems in terms of adhesion to a thermosetting composition layer having a different physical property. In addition, when the above-mentioned three-layered structure is adopted, it is not possible to enhance the mechanical strength of the area near the surface of the insulation layer where the conductive layer is formed. Further, there is also disclosed a film having a two-layered structure in which a heat-resistant resin layer and a thermosetting resin composition layer are adjacent and, when a commercially available film such as polyimide film is used as a heat-resistant resin layer, generally a roughening treatment by a dry method such as mechanical sanding or plasma etching is to be carried out in order to form a conductive layer on the surface thereof. Therefore it is desirable that a roughening treatment by an oxidizing agent which is commonly used in the manufacture of multi-layered printed wiring boards by a build-up system and is more highly productive is used.

In International Laid-Open Patent Application No. WO 01/97582, there is also a description that a heat-resistant resin varnish is applied and dried to make into a film as a heat-resistant resin layer and that a resin varnish is also used after kneading with an appropriate thermosetting resin and resin additive. However, there is only a general description and, with regard to compounding to a resin varnish, there is no disclosure of a specific constitution and there is also no disclosure of the matter of roughening at all. In conclusion, only the above-mentioned three-layered structure disclosed in International Laid-Open Patent Application No. WO 01/97582 is expected to be able to be roughened using an oxidizing agent.

SUMMARY OF THE INVENTION

Accordingly, it is one object of the present invention to provide novel resin compositions having an excellent mechanical strength and being able to be subjected to a roughening treatment with an oxidizing agent as an insulation material used for the manufacture of a multi-layered printed wiring board using a build-up system.

It is another object of the present invention to provide novel adhesive films for interlayer insulation by which a multi-layered printed wiring board having an excellent mechanical strength is able to be easily manufactured.

It is another object of the present invention to provide novel method for making a multi-layered printed wiring board using such an adhesive film.

The present inventors have carried out intensive investigations for solving the above-mentioned problem and found that resin compositions in which a heat-resistant resin soluble in organic solvents, a thermosetting resin, a filler and a resin having polybutadiene structure and/or polysiloxane structure are compounded in a specific ratio are excellent for interlayer insulation materials for multi-layered printed wiring boards in view of mechanical strength and roughening characteristic and that a multi-layered printed wiring board which is excellent in mechanical strength may be easily manufactured by means of a build-up system using an adhesive film having a two-layered structure of this resin composition layer and a specific thermosetting resin layer as a main constitution.

Thus, the present invention provides the following:

(1) A resin composition for interlayer insulation for multi-layered printed wiring board comprising the following components (a) to (d):

(a) a heat-resistant resin which is soluble in organic solvents wherein the heat-resistant resin is one or more heat-resistant resin(s) selected from the group consisting of a polyimide resin, a polyamide-imide resin, a polyamide resin, a polyether imide resin, a polybenzoxazol resin, a polybenzimidazole resin, copolymers thereof, and mixtures thereof;

(b) a thermosetting resin;

(c) a filler; and (d) a resin having a polybutadiene structure and/or a polysiloxane structure, wherein:

said heat-resistant resin (a) and said thermosetting resin (b) are present in a weight ratio of said heat-resistant resin (a) to said thermosetting resin (b) of from 100:1 to 1:1;

said heat-resistant resin (a), said thermosetting resin (b), and said filler (c) are present in relative amounts such that weight ratio of the total amount of said heat-resistant resin (a) and said thermosetting resin (b) to said filler (c) by weight is from 100:1 to 3:2;

said resin having a polybutadiene structure and/or a polysiloxane structure (d) is present in an amount of 0.1 to 15 parts by weight based on 100 parts by weight of said heat-resistant resin (a); and said heat-resistant resin (a), said thermosetting resin (b), said filler (c), and said resin having a polybutadiene structure and/or a polysiloxane structure (d) are present in a total amount of not less than 70% by weight, based on the total weight of said resin composition.

(2) The resin composition for interlayer insulation according to (1), wherein said heat-resistant resin which is soluble in organic solvents (a) is one or more heat-resistant resins selected from the group consisting of a polyimide resin, a polyamide-imide resin, a polyamide resin, copolymers thereof, and mixtures thereof.

(3) The resin composition for interlayer insulation according to (1), wherein said heat-resistant resin which is soluble in organic solvents (a) is a polyamide-imide resin.

(4) The resin composition for interlayer insulation according to (1), wherein said heat-resistant resin which is soluble in organic solvents (a) exhibits a tensile strength of not less than 100 MPa, an elongation at break of not less than 10%, a thermal expansion coefficient between 20 and 150° C. of not more than 60 ppm, and a glass transition temperature of not lower than 160° C.

(5) The resin composition for interlayer insulation according to (1), wherein said thermosetting resin (b) is one or more thermosetting resins selected from the group consisting of an epoxy resin having two or more epoxy groups in a molecule, a polymer of a bismaleimide compound with a diamine compound, a cyanate ester compound, and mixtures thereof.

(6) The resin composition for interlayer insulation according to (1), wherein said thermosetting resin (b) is an epoxy resin having two or more epoxy groups in a molecule.

(7) The resin composition for interlayer insulation according to (1), wherein said filler is one or more fillers selected from the group consisting of acrylic rubber particles, silicon particles, silica, and mixtures thereof.

(8) An adhesive film for multi-layered printed wiring board comprising:

(A) a layer of a resin composition, comprising the resin composition for interlayer insulation mentioned in any of (1) to (7);

(B) a layer of a thermosetting resin composition; and (C) a supporting film, and having a layer structure in the order of said supporting film (C), said layer of a resin composition (A), and said layer of a thermosetting resin composition (B).

(9) An adhesive film according to (8), wherein said layer of a thermosetting resin composition (B) comprises a thermosetting resin composition which is solid at a temperature of 40° C. or lower and melts at a temperature of 140° C. or lower.

(10) An adhesive film according to (8), wherein said layer of a thermosetting resin composition (B) comprises a thermosetting resin composition which has a melt viscosity measured at a measurement starting temperature of 60° C., a temperature increasing rate of 5° C. per minute and a frequency of 1 Hz/deg, of from 4,000 to 50,000 poise at 90° C., from 2,000 to 21,000 poise at 100° C., from 900 to 12,000 poise at 110° C., from 500 to 9,000 poise at 120° C., and from 300 to 15,000 poise at 130° C.

(11) An adhesive film according to (8), wherein said layer of a thermosetting resin composition (B) is protected by a protective film.

(12) An adhesive film according to (8), wherein said layer of a resin composition (A) has a thickness of 5 to 40 μm, said layer of a thermosetting resin composition (B) has a thickness of 10 to 100 μm, and said supporting film (C) has a thickness of 10 to 150 μm.

(13) A multi-layered printed wiring board, which comprises a cured product of the resin composition for interlayer insulation mentioned in any of (1) to (7) as an insulation layer.

(14) A method for making a multi-layered printed wiring board, comprising:

(1) laminating an adhesive film according to (8) to (12) on one side or both sides of a circuit substrate, to obtain a laminated circuit substrate;

(2) subjecting said laminated circuit substrate to a thermosetting treatment to obtain a circuit substrate with an insulation layer;

(3) drilling said circuit substrate with an insulation layer;

(4) removing said supporting film after said steps (1), (2) or (3);

(5) roughening a surface of said insulation layer with an oxidizing agent, to obtain a roughened surface;

(6) forming a conductive layer said on said roughened surface layer by metal plating; and (7) forming a circuit on said conductive layer.

(15) A method for making a multi-layered printed wiring board according to (14), wherein said laminating said adhesive film is carried out with a vacuum laminator.

DETAILED DESCRIPTION OF THE PREFERRED EMBODIMENTS

Thus, in a first embodiment, the present invention provides novel resin compositions for interlayer insulation for a multi-layered printed wiring board having an excellent mechanical strength and being able to be subjected to a roughening treatment by an oxidizing agent and also provides an adhesive film. It is also possible in accordance with the adhesive film of the present invention to easily manufacture a multi-layered printed wiring board having an excellent mechanical strength by way of a roughening step using an oxidizing agent and a step of formation of conductive layer by plating.

Specifically, the present invention provides resin compositions and resin compositions for interlayer insulation for multi-layered printed wiring board which contain the following components (a) to (d):

(a) a heat-resistant resin which is soluble in organic solvents and which is one or more heat-resistant resins selected from the group consisting of a polyimide resin, a polyamide-imide resin, a polyamide resin, a polyether imide resin, a polybenzoxazol resin, a polybenzimidazole resin, copolymers thereof, and mixtures thereof;

(b) a thermosetting resin;

(c) a filler; and (d) a resin having a polybutadiene structure and/or a polysiloxane structure, wherein said heat-resistant resin (a) and said thermosetting resin (b) are present in a weight ratio of said heat-resistant resin (a) to said thermosetting resin (b) of from 100:1 to 1:1;

said heat-resistant resin (a), said thermosetting resin (b), and said filler (c) are present in relative amounts such that weight ratio of the total amount of said heat-resistant resin (a) and said thermosetting resin (b) to said filler (c) by weight is from 100:1 to 3:2;

said resin having a polybutadiene structure and/or a polysiloxane structure (d) is present in an amount of 0.1 to 15 parts by weight based on 100 parts by weight of said heat-resistant resin (a); and said heat-resistant resin (a), said thermosetting resin (b), said filler (c), and said resin having a polybutadiene structure and/or a polysiloxane structure (d) are present in a total amount of not less than 70% by weight, based on the total weight of said resin composition.

The heat-resistant resin (a) of the present invention may be selected from heat-resistant resins such as polyimide resins, polyamide imide resins, polyamide resins, polyether imide resins, polybenzoxazol resins, and polybenzimidazole resins. Copolymers having a chemical structure of any one of those resin are included in these heat-resistant resins. Preferred heat-resistant resins are polyimide resins, polyamide imide resins, and polyamide resins, and polyamide imide resins are particularly preferred.

It is important that the heat-resistant resin of the present invention is soluble in an organic solvent. Heat-resistant resins which are insoluble in an organic solvent are unable to be formulated into the composition by mixing with the other components and, therefore, cannot be used in the present invention. Although there is no particular limitation for the organic solvent, those which are liquid at ambient temperature of 20 to 30° C. and have the property of dissolving the heat-resistant resin are used in view of the nature of the present invention. It is also important that the organic solvent does not react with the heat-resistant resin and the thermosetting resin and, for example, cresol and the like having phenolic hydroxyl groups are excluded.

Examples of the organic solvent which is preferably used in the present invention are ketones such as acetone, methyl ethyl ketone, and cyclohexanone; acetates such as ethyl acetate, butyl acetate, cellosolve acetate, propylene glycol monomethyl ether acetate, and carbitol acetate; carbitols such as cellosolve and butyl carbitol; aromatic hydrocarbons such as toluene and xylene; dimethylformamide; dimethyl acetamide; N-methylpyrrolidone; etc. Two or more organic solvents may be used jointly.

It is preferred that the heat-resistant resin of the present invention exhibits a tensile strength of not less than 100 MPa, an elongation at break of not less than 10%, a thermal expansion coefficient of not more than 70 ppm, and a glass transition temperature is not lower than 160° C.

For the purposes of the present invention, the tensile strength and elongation at break are determined by a method mentioned in JIS (Japanese Industrial Standards) K 7127, while the thermal expansion coefficient and glass transition temperature are determined by a method mentioned in JIS K 7197. Even when the glass transition temperature is higher than decomposition temperature and the substantial glass transition temperature is unable to be observed, that is also within a definition of "glass transition temperature is not lower than 160° C." according to the present invention. In this regard, decomposition temperature is defined as the temperature at which the rate of the reduction of mass as measured according to a method mentioned in JIS K 7120 is 5%.

Preferred concrete commercially available examples of the heat-resistant resin (a) are "RIKACOAT SN 20" and "RIKACOAT PN 20" which are soluble polyimides manufactured by New Japan Chemical Co., Ltd.; "Ultem" which is a polyether imide manufactured by Nippon GE Plastics K. K.; and "VYLOMAX HR 11 NN" and "VYLOMAX HR 16 NN" which are polyamide imides manufactured by Toyobo Co., Ltd.

Each of the heat-resistant resins (a) may be used solely or two or more may be used jointly.

With regard to the thermosetting resin (b) used in the present invention, there is no particular limitation so far as it may be thermally cured at a thermosetting temperature within a range of 150 to 200° C., which is usually adopted in the formation of insulation layers for multi-layered printed wiring boards. Examples of suitable thermosetting resins include epoxy resins having two or more epoxy groups in a molecule, polymers of a bismaleimide compound with a diamine compound, cyanate ester compounds, bismaleimide compounds, bisallyl nadide resins, and benzoxazine compounds. Preferred ones are epoxy resins having two or more epoxy groups in a molecule, polymers of a bismaleimide compound with a diamine compound, and cyanate ester compounds, and epoxy resins having two or more epoxy groups in a molecule are particularly preferred.

In the preparation of an adhesive film of the present invention, that which is liquid or solid at ambient temperature or a mixture thereof is used within such an extent that a film is able to be formed by the resin composition for interlayer insulation layer of the present invention. When a solid thermosetting resin (b) is used, it is preferred that it melt at a temperature of 140° C. or lower in view of the adhesive property of the thermosetting resin composition layer (layer B) to the (layer A) when an insulation layer is formed in the adhesive film of the present invention.

Examples of the epoxy resin are epoxy resins having two or more functional groups in a molecule such as epoxy resins of a bisphenol A type, epoxy resins of a bisphenol F type, phenol novolak epoxy resins, epoxy resins of a bisphenol S type, epoxy resins of an alkylphenol novolak type, epoxy resins of a biphenol type, epoxy resins of a naphthalene type, epoxy resins of a dicyclopentadiene type, epoxy compounds of a condensate of phenol with an aromatic aldehyde having phenolic hydroxyl group, triglycidyl isocyanurate, and alicyclic epoxy resins.

When an epoxy resin is used, an epoxy hardener is necessary. Examples of the epoxy hardener are a hardener of an amine type, a hardener of a guanine type, a hardener of an imidazole type, a hardener of a phenol type, a hardener of an acid anhydride type, a hardener of a hydrazide type, a hardener of a carboxylic acid type, a hardener of a thiol type, and epoxy adducts and microcapsulated ones thereof. It is also possible to use, together with the epoxy hardener, a hardening promoter such as triphenylphosphine, phosphonium borate, and 3-(3,4-dichlorophenyl)-1,1-dimethylurea.

Concrete examples of the epoxy hardener include dicyandiamide, 2-phenyl-4-methyl-5-hydroxymethylimidazole, adducts of 2,4-diamino-6-(2-methyl-1-imidazolylethyl)-1,3,5-triazine with isocyanuric acid, and novolak resins containing a triazine structure (such as the PHENOLITE 7050 series manufactured by Dainippon Ink and Chemicals, Inc.).

With regard to polymer resins of a bismaleimide compound with a diamine compound, "TECHMIGHT E2020" manufactured by Printec Co., Ltd. etc. may be exemplified.

Examples of cyanate ester compounds include "PRIMASET BA200" which is a cyanate ester of a bisphenol A type (manufactured by Lonza Corporation), "PRIMASET BA 230 S" (manufactured by Lonza Corporation), "PRIMASET LECY" which is a cyanate ester of a bisphenol H type (manufactured by Lonza Corporation), "AroCy L 10" (manufactured by Vantico AG), "PRIMASET PT 30" which is a cyanate ester of a novolak type (manufactured by Lonza Corporation), "AroCy XU-371' (manufactured by Vantico AG), and 'AroCy XP 71787.02L" which is a cyanate ester of a dicyclopentadiene type (manufactured by Vantico AG) may be exemplified.

With regard to bismaleimide compounds, "BMI-S" which is 4,4'-diphenylmethane bismaleimide (manufactured by Mitsui Chemicals, Inc.) and "BMI-M-20" which is polyphenylmethane maleimide (manufactured by Mitsui Chemicals, Inc.) may be exemplified.

With regard to bisallyl nadide resins, "BANI-M" which is diphenylmethane-4,4'-bisallylnadic imide (manufactured by Maruzen Petrochemical Co., Ltd.) may be exemplified.

With regard to benzoxadine resin, "Benzoxadine of a B-a type" and "Benzoxadine of a B-m type" manufactured by Shikoku Chemicals Corporation may be exemplified.

Each of these thermosetting resins may be used singly or two or more thereof may be used jointly.

The filler (c) of the present invention is important for producing an appropriate roughened surface and, thus, for making the formation of a conductive layer having an excellent peel strength by metal plating possible. The filler may be classified into inorganic and organic fillers. Inorganic fillers also have the effect of lowering the thermal expansion rate of the cured product, while organic fillers also have the effect of relaxing the stress in the cured product.

Examples of the inorganic filler are silica, alumina, barium sulfate, talc, clay, mica powder, aluminum hydroxide, magnesium hydroxide, calcium carbonate, magnesium carbonate, magnesium oxide, boron nitride, aluminum borate, barium titanate, strontium titanate, calcium titanate, magnesium titanate, bismuth titanate, titanium oxide, barium zirconate and calcium zirconate. Silica is particularly preferred. Inorganic fillers having an average diameter of not larger than 5 μm are preferred. When the average particle size is larger than 5 μm, it may be sometimes difficult to stably carry out the formation of fine patterns in the formation of circuit patterns on a conducted layer which is metal plated after roughening. In order to improve the moisture resistance, that which is subjected to a surface treatment using a surface treating agent such as a silane coupling agent is preferred.

With regard to the organic filler, acrylic rubber particles and silicon particles are preferred.

In view of the formation of appropriate unevenness after the roughening, it is more preferred to use an organic filler having a flat shape. As same noted above for the inorganic fillers, it is also preferred to that the organic fillers have an average particle size of not larger than 5 μm.

Each of the fillers may be used singly, or two or more may be used jointly.

As in the case of filler (c), the resin having a polybutadiene structure and/or a polysiloxane structure (d) of the present invention is important for the formation of a preferred roughened surface on the surface of a cured product by an oxidizing agent.

Examples of resins having a polybutadiene structure are polybutadiene rubbers, epoxy-modified polybutadiene rubbers, urethane-modified polybutadiene rubbers, acrylonitrile-modified polybutadiene rubbers, methacrylonitrile-modified polybutadiene rubbers, acrylonitrile-butadiene rubbers having carboxyl groups, and epoxy resins of an acrylonitrile rubber dispersion type. Examples of resins having a polysiloxane structure are polyimides containing a polysiloxane structure (see, Japan Laid-Open patent nos. JP2002-12667, JP2000-319386, etc.), polyamide-imides containing a polysiloxane structure (see, Japan Laid-Open patent JP2001-123060 etc.). Examples of those which are coomercially available are polyamide-imides containing a polysiloxane structure such as "KS 9100" and "KS 9300" manufactured by Hitachi Chemical Co., Ltd.

Each of the resins having a polybutadiene structure and/or a polysiloxane structure may be used singly, or two or more may be used jointly.

In the resin composition of the present invention, the weight ratio of the heat-resistant resin (a) to the thermosetting resin (b) is within the range of from 100:1 to 1:1, more preferably in the range of from 100:1 to 5:3. When the amount of the heat-resistant resin (a) is too small, it is difficult to achieve the necessary physical properties such as tensile strength, elongation at break, thermal expansion coefficient, and glass transition temperature for the resin composition. In addition, the heat-resistant resin(a) has a low resistance to an alkaline solution of permanganic acid and, therefore, there may be the case where the physical properties of the cured substance after roughening deteriorate when the ratio of the heat-resistant resin (a) is too high. When the amount of the thermosetting resin (b) is small, the adhesive force of at the interface with the thermosetting resin composition layer, i.e., layer (D), becomes weak and, therefore, there is a tendency that it is difficult to achieve a practical adhesive film to be used for multi-layered printed wiring boards.

In the thermosetting resin composition of the present invention, the weight ratio of the total amount of the heat-resistant resin (a) and the thermosetting resin (b) to the filler (c) is from 100:1 to 3:2, more preferably is from 100:3 to 20:11. When the amount of the filler (c) is more than the above range, it is difficult to achieve the physical properties necessary for the film for a circuit substrate of the present invention. On the other hand, when the amount of the filler (c) is less than that, it is difficult to achieve a sufficiently uneven surface by a roughening with an oxidizing agent.

In the thermosetting resin composition of the present invention, the amount of the resin having a polybutadiene structure and/or a polysiloxane structure (d) is within the range of from 0.1 to 15 parts by weight, based on to 100 parts by weight of the heat-resistant resin (a), more preferably in the range of from 0.5 to 10 parts by weight, based on 100 parts by weight of the heat-resistant resin (a). When the amount of the resin having a polybutadiene structure and/or a polysiloxane structure (d) is greater than that range, the mechanical strength of the cured product is lowered. When the amount of the resin having a polybutadiene structure and/or a polysiloxane structure (d) is less than that, it is difficult to achieve a sufficiently uneven surface by roughening with an oxidizing agent.

In the resin composition for interlayer insulation layer according to the present invention, it is also possible to compound other components other than the components (a) to (d) so long as the advantages of the present invention are fully achieved. However, it is necessary that the total compounding amount of the components (a) to (d) is not less than 70% by weight (i.e., from 70% by weight to 100% by weight), based on the total weight of the resin composition, more preferably not less than 75% by weight, based on the total weight of the resin composition, still more preferably not less than 80% by weight, based on the total weight of the resin composition, further more preferably not less than 85% by weight, based on the total weight of the resin composition, and still further more preferably not less than 90% by weight, based on the total weight of the resin composition. When the total compounding amount of the components (a) to (d) is less than 70% by weight, there is a tendency that the advantages of the present invention are not fully achieved.

Examples of other components which may be compounded with the resin composition for interlayer insulation layer according to the present invention include thickeners such as orben and bentone; antifoaming agents or leveling agents such as those of a silicone type, a fluorine type, and a polymer type; agents for giving a close adhesion such as those of an imidazole type, a thiazole type, a triazole type and a silane coupling agent; resin additives such as coloring agents including Phthalocyanine Blue, Phthalocyanine Green, Iodine Green, Disazo Yellow, and carbon black; and any resin component which is other than the components (a), (b) and (d).

In the resin composition for interlayer insulation layer according to the present invention, it is possible to achieve such physical properties that tensile strength, elongation at break, thermal expansion coefficient between 20 and 150° C. and glass transition temperature of the cured product thereof are not less than 100 MPa, not less than 5%, not more than 70 ppm and not lower than 150° C., respectively and, more preferably, it is possible to achieve such physical properties that tensile strength, elongation at break, thermal expansion coefficient between 20 and 150° C. and glass transition temperature of the cured product thereof are not less than 110 MPa, not less than 10%, not more than 50 ppm and not lower than 200° C., respectively.

The resin composition for interlayer insulation layer according to the present invention is able to easily form a conductive layer by metal plating when it is made into a cured product by means of thermosetting treatment if the surface of the cured product is roughened by an oxidizing agent. Like this, the surface of the cured product is roughened by an oxidizing agent and a conductive layer is formed by a metal plating, it is possible to achieve a peel strength of a conductive layer of not less than 0.6 kgf/cm ($5.9 \times 10^2$ N/m) or, preferably, not less than 0.7 kgf/cm ($6.9 \times 10^2$ N/m). In addition, the said cured product has an excellent mechanical strength and, when the resin composition for interlayer insulation layer of the present invention is used, it is now possible to directly form a conductive layer by metal plating on the surface of a cured product having an excellent mechanical strength. Moreover, when a constitution where a conductive layer is directly produced on the insulation layer having an excellent mechanical strength is formed, an effect of suppression of cracks which are generated at the interface of conductive layer and insulation layer as a base point is able to be expected.

The adhesive film of the present invention will now be illustrated. The adhesive film for a multi-layered printed wiring board according to the present invention has a resin composition layer (layer A) comprising the resin composition for interlayer insulation of the present invention as mentioned already, a thermosetting resin composition layer (layer B) and a supportive film (layer C) and, as a main layer constitution, it has a layer constitution of layer C, layer A and layer B in this order.

A supportive film which is the layer C acts as a supporter when an adhesive film is manufactured and, when a multi-layered printed wiring board is manufactured, it is usually and finally peeled off or removed. Examples of the supportive film are polyolefin such as polyethylene and poly (vinyl chloride); polyester such as polyethylene terephthalate (hereinafter, it may be abbreviated as "PET") and polyethylene naphthalate; polycarbonate; polyimide; releasing paper; and metal foil such as copper foil and aluminum foil. When copper foil is used as a supportive film, it is also possible that the said copper foil per se is made into a conductive layer to form a circuit. Examples of the copper foil in that case are rolled copper foil and electrolyzed copper foil and those having a thickness of 2 to 36 μm are commonly used. When a thin copper foil is used, a copper foil equipped with a carrier may be used for improving the working ability. In view of improving the adhesive force between the resin and the metal foil, it is preferred that the surface of the metal foil to which resin varnish is to be applied is a matte surface and, if necessary, that where a chemical treatment such as coupling is applied on the applied surface of the copper foil may be used as well. When the copper foil is to be removed, that is able to be removed by means of etching using an etching solution such as ferric chloride and cupric chloride. The supportive film may be previously subjected to a mat treatment, a corona treatment or a releasing treatment. Thickness of the supportive film is usually 10 to 150 μm and, preferably, 25 to 50 μm.

"A thermosetting resin composition layer" which is a layer B plays such roles that, in lamination, it directly contacts to a circuit substrate and melts to coat the circuit substrate and that, at the same time, it flows into through-hole and via hole existing in the circuit substrate to fill the inner area of the holes. The thermosetting composition used for the said layer is used after forming a layer on an adhesive film and, therefore, that which is solid at the temperature of not higher than 40° C. is usually used. It is also preferable that the melting takes place at least not higher than 140° C. or, preferably, not higher than 100° C. because it is preferable that it can be laminated on a circuit substrate at 70 to 140° C. which is the common laminating temperature in a vacuum lamination method.

In the through-hole of the multi-layered printed wiring board, its diameter is usually 0.1 to 0.5 mm and its depth is usually 0.1 to 1.2 mm and it is preferred that the layer B shows such a melting property that filling of the resin is possible usually within that range. When both sides of the circuit substrate are laminated, one-half of the through-hole may be filled. Such a characteristic is able to be characterized by a curve for temperature vs. melt viscosity by measurement of dynamic viscoelasticity of the resin composition (see, International Laid-Open Patent Application WO 01/97,582).

In case the melt viscosity at each temperature is the value as shown in Table 1 or, preferably, as shown in Table 2 when a melt viscosity is measured at the rising rate of 5° C./minute where the temperature in starting the measurement is 60° C. and a curve of temperature vs. melt viscosity is determined, that satisfies the above-mentioned characteristic and is preferred as an adhesive film to be used for a vacuum lamination method.

TABLE 1

| Temperature (° C.) | Melt Viscosity (Poise) |
|---|---|
| 90 | 4,000-50,000 |
| 100 | 2,000-21,000 |
| 110 | 900-12,000 |
| 120 | 500-9,000 |
| 130 | 300-15,000 |

TABLE 2

| Temperature (° C.) | Melt Viscosity (Poise) |
|---|---|
| 90 | 10,000-25,000 |
| 100 | 5,000-10,000 |
| 110 | 2,000-6,000 |
| 120 | 1,000-5,000 |
| 130 | 600-3,000 |

The thermosetting resin composition constituting the layer B contains a thermosetting resin and, with regard to the thermosetting resin, that which is the same the thermosetting resin which is a component (b) for the resin composition constituting the layer A may be exemplified. When an epoxy resin is used as the thermosetting resin, an epoxy hardener is further necessary. With regard to the epoxy hardener, that which was already mentioned hereinabove may be exemplified. It is also possible to use together with a hardening accelerator such as triphenylphosphine, phosphonium borate, and 3-(3,4-dichlorophenyl)-1,1-dimethylurea.

In the thermosetting resin composition constituting the layer B, it is recommended that its preparation is carried out in such a manner that a resin having a lower softening point than the actually-used laminating temperature is contained in an amount of not less than 10% by weight or, more preferably, 10 to 90% by weight. The laminating temperature is usually within a range of 70° C. to 140° C. When it is less than 10% by weight, there are some cases where it is difficult to obtain a melting viscosity for the filling of through-hole and via hole without void in melting the thermosetting resin composition upon lamination. On the other hand, when it is more than 90% by weight, fluidity of the melted resin composition is too high and there are some cases where it is difficult to form a uniform insulation layer upon a vacuum lamination.

In addition, in the said thermosetting resin composition, it is recommended that the preparation is carried out in such a manner that the contained amount of the component which is liquid at room temperature such as 20 to 30° C. is made 10 to 55% by weight. The term "liquid component" means a liquid component which is optionally contained in the thermosetting resin composition and its examples are liquid resin and organic solvent. Even when the thermosetting resin is liquid, that is included in the resin which is liquid at room temperature mentioned above. The case where a hardener for the thermosetting resin is a liquid resin is included herein as well. When the liquid component is less than 10% by weight, plasticity and cutting processability of the adhesive film are not sufficient and that is not so preferred in view of handling of the adhesive film. On the other hand, when it is more than 55% by weight, fluidity at room temperature is high and, upon winding with a roll in the manufacture of the adhesive film, there are tendencies that oozing out of the resin from the cut surface happens and that peeling property with a supportive film and a protective film becomes bad.

Moreover, in the said thermosetting resin composition, it is more preferred that a high molecular compound where a weight-average molecular weight is from 5,000 to 100,000 is contained in an amount of 5 to 50% by weight. For example, when the adhesive film of the present invention is laminated at a relatively high temperature, fluidity of the resin tends to be too high but, when the said high molecular compound is added, it is now easy for suppressing the flow of the resin upon lamination and for adjusting to achieve a preferred fluidity. Incidentally, when the weight-average molecular weight is less than 5,000, an, effect for suppressing the fluidity is not sufficient while, when it is more than 100,000, solubility to organic solvents becomes bad whereupon it is difficult to prepare a resin varnish which is necessary for the formation of a thermosetting resin composition layer.

Examples of the high molecular compound where a weight-average molecular weight is 5,000 to 100,000 are phenoxy resin, polyacrylic resin, polyimide resin, polyamide-imide resin, polycyanate resin, polyester resin and thermosetting polyphenylene ether resin where a weight-average molecular weight is 5,000 to 100,000. Among them, phenoxy resin is preferred and its examples are phenoxy resins such as Phenotohto YP 50 (manufactured by Tohto Kasei Co., Ltd.), E-1256 (manufactured by Japan Epoxy Resin Co., Ltd.), brominated phenoxy resins such as YPB-40-PXM 40 (manufactured by Tohto Kasei Co., Ltd.) and phenoxy resins having a bisphenol S structure such as YL 6747 H 30 (manufactured by Japan Epoxy Resin Co., Ltd.).

In the thermosetting resin composition, a filler may be added. The adding amount when the filler is added varies depending upon the characteristic of the epoxy resin composition of the present invention and upon the aimed function and, when the said thermosetting resin composition is 100% by weight, the filler is compounded usually within a range of 10 to 75% by weight and, preferably, 20 to 65% by weight. The filler is roughly classified into inorganic and organic fillers and each of them may be exemplified as those mentioned already.

The adhesive film of the present invention is able to be manufactured in such a manner in accordance with the method which has publicly known among persons skilled in the art that, for example, a resin varnish where a resin composition is dissolved in an organic solvent, the resin varnish is applied to a supportive film as a support and the organic solvent is dried by means of heating or blowing of hot air whereupon the resin composition layer is formed.

Method for the manufacture of an adhesive film which is the first embodiment of the present invention or an adhesive film having a layer structure in the order of layer C, layer A and layer B will be illustrated. Firstly, a supportive film of the layer C is used as a supporter and the resin varnish for the resin composition for interlayer insulation according to the present invention is prepared. This is applied onto the said supporter and dried to give a layer A. The resulting film comprising the layers C and A are used as a supporter and a resin varnish for the thermosetting resin composition according to the present invention is prepared and that is applied onto the layer A followed by drying to give a layer B.

It is also possible that a layer B is formed on a supportive film layer C and then a film comprising the layers C and A and a film comprising the layers B and C are laminated. In that case, the adhesive film of the present invention is in a layer structure in the order of layer C, layer A, layer B and layer C adjacent to the layer B functions as a protective film for the layer B.

In the adhesive film of the present invention, the layer A may be made in a state of being semi-cured within such an extent that, during the thermosetting process, adhesive property of the layer A to the layer B is not inhibited. For example, when a commercially available film such as polyimide film is used as a heat-resistant layer as in the conventional cases, a problem where adhesive property to the thermosetting resin layer is not fully achieved often happens while, in the adhesive film of the present invention, it is possible to achieve a good adhesive property between the layer A and the layer B.

Examples of the organic solvent for preparing a varnish are ketones such as acetone, methyl ethyl ketone, and cyclohexanone; acetates such as ethyl acetate, butyl acetate, cellosolve acetate, propylene glycol monomethyl ether acetate, and carbitol acetate; carbitols such as cellosolve and butyl carbitol; aromatic hydrocarbons such as toluene and xylene; dimethyl formamide; dimethyl acetamide; N-methylpyrrolidone; etc. Two or more organic solvents may be used jointly.

Although there is no particular limitation for a drying condition, drying is carried out in such a manner that the contained rate of the organic solvent in a resin composition layer is made usually not more than 10% by weight or, preferably, not more than 5% by weight. Since the drying condition also affects the melt viscosity of the layer C, it is preferred to set up a drying condition which satisfies the above-mentioned melt viscosity characteristic. Although it also varies depending upon the amount of the organic solvent in the varnish, it is possible that a varnish containing, for example, 30 to 60% by weight of an organic solvent is dried for about 3 to 10 minutes. It is possible to appropriately set up an advantageous drying condition according to simple experiments conducted by persons skilled in the art.

It is preferred that the thickness of the layer A is within a range of 5 to 40 μm. With regard to the thickness of the layer B, it is preferred to be within a range of 10 to 100 μm since the thickness of a conductive layer in the circuit substrate is usually within a range of 5 to 70 μm.

The layer B may be protected by a protective film. As a result of protection by a protective film, it is possible to prevent scratch on and adhesion of dust or the like to the surface of the resin composition layer. The protective film is peeled off upon lamination. With regard to the protective film, it is possible to use the same material as that for the supportive film. Although there is no particular limitation for the thickness of the protective film, it is preferred to be within a range of 1 to 40 μm.

The supportive film of the present invention is peeled off or removed after lamination to a circuit substrate or after forming an insulation layer by a thermosetting step (or after a further drilling step). When the supportive film is peeled off or removed after thermosetting step of the adhesive film, it is possible to prevent adhesion of dust or the like in a curing step. When the peeling-off is conducted after the curing, it is usual that the supportive film is previously subjected to a releasing treatment. Incidentally, it is preferred that the resin composition layer produced on the supportive film is formed in such a manner that the area of the layer is smaller than the area of the supportive film. The adhesive film is also able to be wound in a roll and then stored and preserved.

Now, a method for the manufacture of a multi-layered printed wiring board of the present invention using the adhesive film of the present invention will be illustrated. The adhesive film of the present invention is able to be advantageously laminated to the circuit substrate using a vacuum laminator. As to the vacuum lamination, a commercially available vacuum laminator may be used. Examples of the commercially available vacuum laminator are a vacuum applicator manufactured by Nichigo-Morton Co., Ltd., a vacuum & pressure laminator manufactured by Meiki Co., Ltd., a roll type drycoater manufactured by Hitachi Industries Co., Ltd., and a vacuum laminator manufactured by Hitachi AIC Inc.

When an adhesive film has a protective film in conducting a lamination, the said protective film is removed and the adhesive film is adhered to a circuit substrate with pressure and heating. Preferred condition for the lamination is that the adhesive film and the circuit substrate are previously heated if necessary, the adhesion temperature (laminating temperature) is preferably made 70 to 140° C., the adhesion pressure is preferably made 1 to 11 kgf /cm$^2$(9.8×10$^4$ to 107.9×10$^4$ N/m$^2$) and the air pressure is made not higher than 20 mmHg (26.7 hPa). Method for the lamination may be either by a batch system or by a continuous system using a roll.

After an adhesive film is laminated to a circuit substrate as such, it is cooled down to about room temperature. If it is necessary to peel off a supportive film, peeling-off takes place, and then the epoxy resin composition which is laminated to the circuit substrate is subjected to a thermosetting step. Condition for the thermosetting step is selected from the range of 150 to 220° C. for 20 to 180 minutes and, more preferably, it is 160 to 200° C. for 30 to 120 minutes. When a supportive film which is subjected to a releasing treatment is used, the supportive film may be peeled off after it is subjected to a thermosetting step.

After an insulation layer which is a cured product of the epoxy resin composition is formed as such, the insulation layer and the circuit substrate may be drilled, if necessary, by means of drill, laser, plasma or a combination thereof to form via holes or through-holes. Drilling by means of laser such as carbon dioxide gas laser or YAG laser is commonly used.

After that, surface of the insulation layer (surface of cured product of the epoxy resin composition) is subjected to a roughening treatment using an oxidizing agent. Examples of the oxidizing agent are permanganate salt (such as potassium permanganate and sodium permanganate), bichromate, ozone, hydrogen peroxide, sulfuric acid, and nitric acid. Preferred ones are oxidizing agents which have been commonly used for roughening of insulation layer in the manufacture of multi-layered printed wiring board by a build-up system. It is preferred to roughen using an alkaline permanganate solution (such as an aqueous solution of sodium hydroxide containing potassium permanganate or sodium permanganate).

After that, a conductive layer is formed by a method where non-electrolytic plating and electrolytic plating are combined on the surface of a resin composition layer where uneven anchors are formed by means of a roughening treatment. It is also possible that a plated resist which is a reversed pattern to a conductive layer is formed and a conductive layer is formed only by means of a non-electrolytic plating. When an annealing treatment is carried out at 150 to 200° C. for 20 to 90 minutes after formation of a conductive layer, the peel strength of the conductive layer is able to be further improved and stabilized. With regard to a method for a circuit formation by means of a pattern processing of a conductive layer, it is possible to use a method which is known among persons skilled in the art such as a subtractive method and a semi-additive method.

The term "circuit substrate" used in the present invention mostly means that where pattern-processed conductive layer(s) (circuit(s)) is/are formed on one or both side(s) of a substrate such as glass epoxy, metal substrate, polyester substrate, polyimide substrate, BT resin substrate and thermosetting polyphenylene ether substrate. A multi-layered printed wiring board where a conductive layer and an insulation layer are alternately layered and one or both side(s) is/are subjected to a pattern processing giving a conductive layer (circuit) is also included in the circuit substrate as defined in the present invention. Incidentally, it is preferred in view of close adhesion of the insulation layer to the circuit substrate that the surface of the conductive circuit layer is previously subjected to a roughening treatment by a blackening treatment or the like.

Other features of the invention will become apparent in the course of the following descriptions of exemplary embodiments which are given for illustration of the invention and are not intended to be limiting thereof.

EXAMPLES

In the following examples, and throughout this specification, all parts and percentages are by weight, and all temperatures are in degrees Celsius, unless expressly stated to be otherwise.

Example 1

Epoxy resin of a bisphenol A type "EPIKOTE 828" (30 parts) (epoxy equivalent: 190; manufactured by Japan Epoxy Resin Co., Ltd.), 13 parts of a solution of a phenol novolak resin containing a triazine ring in 2-butanone "PHENOLITE LA 7052" (nonvolatile matter: 60% by weight; phenoxy group equivalent of nonvolatile matter: 120; manufactured by Dainippon Ink and Chemicals, Inc.), 1 part of silicon resin particles having a flat shape "AGM 101" (manufactured by Takemoto Oil & Fat Co., Ltd.) (average particle size: 0.41 µm) and 3 parts of spherical silica (average particle size: 1 µm) were mixed, dispersed using a roll and mixed with 460 parts of polyamide-imide "HR 11 NN" (nonvolatile matter: 15% by weight; tensile strength: 150 MPa; elongation at break: 800; thermal expansion coefficient: 42 ppm; glass transition temperature: 300° C.; manufactured by Toyobo Co., Ltd.) and 15 parts of siloxane-modified polyamide-imide "KS 9100" (nonvolatile matter: 31% by weight; manufactured by Hitachi Chemical Co., Ltd. ) to prepare a resin varnish of the resin composition. The resin varnish was applied on a polyethylene terephthalate film having a thickness of 38 µm using a bar coat to make the resin thickness after drying 30 µm and dried at 80 to 140° C. (110° C. on average) for about 16 minutes to prepare a film comprising a resin composition layer (layer A) and supporting film (layer C).

This film was heated at 140° C. for 60 minutes, the resin composition layer was peeled off from the polyethylene terephthalate film and heating was conducted at 200° C. for 3 hours more to give a cured product of the resin composition layer. The tensile test was carried out in accordance with JIS K 7127 using test pieces in a dumbbell shape which were cut out from this cured product to determine tensile strength and elongation at break of the cured product whereupon the following data were obtained. Thus, the tensile strength was 110 MPa, and the elongation at break was 13%. The thermal expansion coefficient and the glass transition temperature were measured in accordance with JIS K7197 using the same test piece, and the following data were obtained. Thus, the thermal expansion coefficient was 41 ppm, and the glass transition temperature was not lower than 250° C.

Example 2

Epoxy resin of a bisphenol A type "EPIKOTE 828" (15 parts) (epoxy equivalent: 190; manufactured by Japan Epoxy Resin Co., Ltd.), 10 parts of an aromatic hydrocarbon solvent "IPUSOL 150" (manufactured by Idemitsu Petrochemical Co., Ltd.), 1 part of polybutadiene rubber in which the terminus is epoxydized "DENAREX R 45 EPT" (manufactured by Nagase Kasei Kogyo K. K.), 3 parts of fine particles of acrylic rubber "AC 3832" (manufactured by Ganz Chemical Co., Ltd. ) and 40 parts of spherical silica were mixed and dispersed using a roll. To this were added a solution of 35 parts of a polymer "TECHMIGHT E 2020" of bismaleimide and diamine compound (manufactured by Printec Co., Ltd.) in 50 parts of cyclohexanone prepared by heating followed by cooling to room temperature and a solution of 0.2 part of 1,8-diazabicyclo(5,4,0) undecane in 2 parts of 2-butanone by heating followed by cooling to room temperature and then 560 parts of a polyamide-imide "HR 11 NN" (nonvolatile matter: 15% by weight; tensile strength: 150 MPa; elongation at break: 80%; thermal expansion coefficient: 42 ppm; glass transition temperature: 300° C.; manufactured by Toyobo Co., Ltd.) were added thereto to prepare a varnish of a resin composition. After that, the resin varnish was applied on a polyethylene terephthalate film having a thickness of 38 µm using a bar coat to make the resin thickness after drying 30 µm and dried at 80 to 140° C. (110° C. on average) for about 16 minutes to prepare a film comprising a resin composition layer (layer A) and a supportinge film (layer C).

This film was heated at 140° C. for 60 minutes, the resin composition layer was peeled off from the polyethylene terephthalate film, and heating was conducted at 200° C. for 3 hours more to give a cured product of the resin composition layer. The tensile test was measured in accordance with JIS K 7127 using a test piece in a dumbbell shape which was cut out from this cured product to determine tensile strength and elongation at break of the cured product whereupon the following data were obtained. Thus, the tensile strength was 120 MPa, and the elongation at break was 6%. The thermal expansion coefficient was 30 ppm, and the glass transition temperature was 225° C.

Example 3

Epoxy resin of a bisphenol A type "EPIKOTE 828" (15 parts) (epoxy equivalent: 190; manufactured by Japan Epoxy Resin Co., Ltd.), 10 parts of an aromatic hydrocarbon solvent "IPUSOL 150" (manufactured by Idemitsu Petrochemical Co., Ltd.), 1 part of polybutadiene rubber in which the terminus is epoxydized "DENAREX R 45 EPT" (manufactured by Nagase Kasei Kogyo K. K.), 3 parts of fine particles of acrylic rubber "AC 3832" (manufactured by Ganz Chemical Co., Ltd. ) and 40 parts of spherical silica were mixed and dispersed using a roll. To this were added 15 parts of epoxy resin of a bisphenol A type "EPIKOTE 828" (epoxy equivalent: 190; manufactured by Japan Epoxy Resin Co., Ltd.), then a solution of 0.4 part of 1,8-diazabicyclo[5,4,0]undecane in 3.6 parts of 2-butanone by heating followed by cooling to room temperature was added and, after that, 450 parts of a polyamide imide "HR 11 NN" (nonvolatile matter: 15% by weight; tensile strength: 150 MPa; elongation at break: 80%; thermal expansion coefficient: 42 ppm; glass transition temperature: 300° C.; manufactured by Toyobo Co., Ltd.) were added thereto to prepare a varnish of a resin composition. After that, the resin varnish was applied on a polyethylene terephthalate film having a thickness of 38 µm using a bar coat to make the resin thickness after drying 30 µm and dried at 80 to 140° C. (110° C. on average) for about 16 minutes to prepare a film comprising a resin composition layer (layer A) and a supporting film (layer C).

This film was heated at 140° C. for 60 minutes, the resin composition layer was peeled off from the polyethylene terephthalate film, and heating was conducted at 200° C. for 3 hours more to give a cured product of the resin composition layer. The tensile test was measured in accordance with JISK 7127 using a test piece in a dumbbell shape which was cut out from this cured product to measure tensile strength and elongation at break whereupon the following data were obtained. Thus, the tensile strength was 110 MPa, and the elongation at break was 5.7%. The thermal expansion coefficient was 35 ppm, and the glass transition temperature was 195° C.

Reference Example 1

To 20 parts of epoxy resin of a bisphenol A type "EPIKOTE 828" (epoxy equivalent: 190; manufactured by Japan Epoxy Resin Co., Ltd. ) and a solution of 35 parts of epoxy resin of a cresol novolak type "EPIKOTE N 673" (epoxy equivalent: 215; softening point: 78° C.; manufactured by Dainippon Ink and Chemicals, Inc.) in 2-butanone by heating followed by cooling to room temperature were added 45 parts of a 2-butanone solution "PHENOLITE LA 7052" (nonvolatile matter: 60% by weight; phenolic hydroxyl group equivalent of the nonvolatile matter: 120; manufactured by Dainippon Ink and Chemicals, Inc.) of phenol novolak resin containing a triazine ring, 70 parts of a cyclohexanone solution "YL-6746H 30" (nonvolatile matter: 30% by weight; weight-average molecular weight: 30,000; manufactured by Japan Epoxy Resin Co., Ltd. ) of a phenoxy resin comprising epoxy resin of a bixylenol type "EPIKOTE YX-4000" (epoxy equivalent: 185; manufactured by Japan Epoxy Resin Co., Ltd. ) and bisphenol S, 18 parts of spherical silica and 2 parts of finely disintegrated silica, and the mixture was subjected to a roll dispersion to prepare a varnish of a thermosetting resin composition. The resin varnish was applied on a polyethylene terephthalate film having a thickness of 38 µm using mbar coat to make the resin thickness after drying 45 µm and dried at 80 to 120° (100° C. on average) for about 8 minutes to prepare a film comprising a supporting film (layer C) and a thermosetting resin composition layer (layer B).

With regard to the thermosetting resin composition layer (layer B), its dynamic viscoelasticity was measured using a Rheosol-G 3000 manufactured by UBM Co., Ltd. The measurement was carried out using a parallel plate and under the conditions that a tablet having a diameter of 20 mm and a thickness of about 2.3 mm (about 1 g in weight) was used as the measuring sample, the initial temperature was about 60° C., the temperature-rising rate was 5° C. per minute, the measuring interval temperature was 2.5° C., the frequency was 1 Hz/deg, and the static loading was 100 g constantly. The following Table 3 shows the melt viscosity values at each temperature.

TABLE 3

| Temperature (° C.) | Melt Viscosity (poise) |
| --- | --- |
| 70 | 116,000 |
| 80 | 37,000 |
| 90 | 13,000 |
| 100 | 5,300 |
| 110 | 2,700 |
| 120 | 2,100 |
| 130 | 1,800 |
| 140 | 1,800 |

Example 4

The film prepared in Example 1 and the film prepared in Reference Example 1 were adhered by pressing for 15 seconds under such conditions that the degree of vacuum was 1 hPa (0.75 mmHg), the adhering temperature was 100°

C., and the adhering pressure was 6 kg/cm² (58.8×10⁴ N/m²) using a vacuum & pressure laminator manufactured by Meiki Co., Ltd. so as to make the resin composition sides thereof faced each other whereupon an adhesive film was prepared.

Example 5

The film prepared in Example 2 and the film prepared in Reference Example 1 were adhered by pressing for 15 seconds under such conditions that the degree of vacuum was 1 hPa (0.75 mmHg), the adhering temperature was 100° C., and the adhering pressure was 6 kg/cm² (58.8×10⁴ N/m²) using a vacuum & pressure laminator manufactured by Meiki Co., Ltd. so as to make the resin composition sides thereof faced each other whereupon an adhesive film was prepared.

Example 6

The film prepared in Example 3 and the film prepared in Reference Example 1 were adhered by pressing for 15 seconds under such conditions that the degree of vacuum was 1 hPa (0.75 mmHg), the dhering temperature was 100° C., and the adhering pressure was 6 kg/cm² (58.8×10⁴ N/m²) using a vacuum & pressure laminator manufactured by Meiki Co., Ltd. so as to make the resin composition sides thereof faced each other whereupon an adhesive film was prepared.

Example 7

Onto a copper surface of a glass epoxy copper-lined layered plate, in which the total thickness was 0.4 mm and the thickness of the conductive layer was 35 µm, which had been previously subjected to a blackening treatment, the thermosetting resin composition layer (layer B) of the adhesive film prepared in Example 5 was adhered in a state of being faced to the copper surface by pressing for 15 seconds using a vacuum & pressure laminator manufactured by Meiki Co., Ltd. under such conditions that the degree of vacuum was 1 hPa (0.75 mmHg), the adhering temperature was 100° C., and the adhering pressure was 6 kg/cm² (58.8×10⁴ N/m²) and, after that, the supportive film was peeled off, followed by subjecting to a thermosetting treatment at 180° C. for 90 minutes.

The substrate after the setting treatment was firstly dipped in a swelling solution using "Swelling Dip Securiganth P" (manufactured by Atotech Japan Co., Ltd.) at 80° C. for 5 minutes, then dipped in an alkaline permanganate solution at 80° C. for 10 minutes so as to roughen the surface of the cured product of the resin composition layer (layer A) and, finally, the manganese which remained on the surface was removed by means of reduction. The surface of the layer A which was subjected to a roughening treatment was applied with a catalyst for non-electrolytic copper plating and then dipped in a non-electrolytic plating solution at 32° C. for 30 minutes to form a non-electrolytic copper-plated film of 1.5 µm. This was dried at 120° C. for 30 minutes, washed with an acid and subjected to an electric copper plating for 12 minutes at a cathode current density of 2.0 A/dm² using a phosphorus-containing copper plate as an anode whereupon a copper-plated film having a thickness of 5 µm was prepared. This was annealed at 200° C. for 180 minutes and then the adhesive strength (peel strength) between the plated layer and the thermosetting product was measured and found to be 0.8 kgf/cm (7.8×10² N/m).

Example 8

Onto the copper surface of a glass epoxy copper-lined layered plate, in which the total thickness was 0.4 mm and the thickness of the conductive layer was 35 µm, which had been previously subjected to a blackening treatment, the surface of the thermosetting resin composition layer (layer B) of the adhesive film prepared in Example 5 was adhered in a state of being faced to the copper surface by pressing for 15 seconds using a vacuum & pressure laminator manufactured by Meiki Co., Ltd. under such conditions that the degree of vacuum was 1 hPa (0.75 mmHg), the adhering temperature was 100° C., and the adhering pressure was 6 kg/cm² (58.8×10⁴ N/m²) and, after that, the supporting film was peeled off, followed by subjecting to a thermosetting treatment at 180° C. for 30 minutes.

On the substrate after the setting treatment, a copper-plated film having a thickness of 5 µm was formed by the same method as in Example 7. This was annealed at 200° C. for 180 minutes, and then the adhesive strength (peel strength) between the plated layer and the cured product was measured and found to be 1.0 kgf/cm (9.8×10² N/m).

Example 9

Onto the copper surface of a glass epoxy copper-lined layered plate, in which the total thickness was 0.4 mm and thickness of the conductive layer was 35 µm, which had been previously subjected to a blackening treatment, the surface of the thermosetting resin composition layer (layer B) of the adhesive film prepared in Example 6 was adhered thereto in a state of being faced to the copper surface by pressing for 15 seconds using a vacuum & pressure laminator manufactured by Meiki Co., Ltd. under such conditions that the degree of vacuum was 1 hPa (0.75 mmHg), the adhering temperature was 100° C., and the adhering pressure was 6 kg/cm² (58.8×10⁴ N/m²) and, after that, the supportive film was peeled off, followed by subjecting to a thermosetting treatment at 180° C. for 30 minutes.

On the substrate after the setting treatment, a copper-plated film having a thickness of 5 µm was formed by the same method as in Example 7. This was annealed at 200° C. for 180 minutes, and then the adhesive strength between the plated layer and the cured product was measured and found to be 0.9 kgf/cm (8.8×10² N/m).

Comparative Example 1

To 20 parts of epoxy resin of a bisphenol A type "EPIKOTE 828" (epoxy equivalent: 190; manufactured by Japan Epoxy Resin Co., Ltd. ) and a solution of 35 parts of epoxy resin of a cresol novolaktype "EPICLON N 673" (epoxy equivalent: 215; softening point: 78° C.; manufactured by Dainippon Ink and Chemicals, Inc.) in 2-butanone which were previously prepared by heating followed by cooling to room temperature were added 45 parts of a 2-butanone solution "PHENOLITE LA 7052" (nonvolatile matter: 60% by weight; phenolic hydroxyl group equivalent of the nonvolatile matter: 120; manufactured by Dainippon Ink and Chemicals, Inc.) of phenol novolak resin containing a triazine ring, 70 parts of a cyclohexanone solution "YL-6746 H 30" (nonvolatile matter: 30% by weight; weight-average molecular weight: 30,000; manufactured by Japan Epoxy Resin Co., Ltd.) of a phenoxy resin comprising epoxy resin of a bixylenol type "EPIKOTE YX-4000" (epoxy equivalent: 185; manufactured by Japan Epoxy Resin Co., Ltd.) and bisphenol S, 18 parts of spherical silica and 2 parts of finely disintegrated silica and the mixture was subjected to a roll dispersion to prepare a varnish of a resin composition. The varnish was applied on a polyethylene terephthalate film having a thickness of 38 μm using a bar coat to make the resin thickness after drying 30 μm and dried at 80 to 120° C. (100° C. on average) for about 8 minutes to prepare a film comprising the resin composition layer and the supporting film.

This film was heated at 140° C. for 60 minutes, the resin composition layer was peeled off from the polyethylene terephthalate film, and heating was conducted at 180° C. for 90 minutes to give a cured product. In accordance with JIS K 7127, a test piece in a dumbbell shape was cut out from this cured product. The tensile test was measured using the test piece to measure tensile strength and elongation at break whereupon the following data were obtained. Thus, the tensile strength was 85 MPa and the elongation at break was 1.8%.

The resin composition and adhesive film of the present invention are preferably used for an interlayer insulation materials for a multi-layered printed wiring board. Especially the adhesive film of the present invention is useful for introducing insulation layer which is excellent for the mechanical properties of a multi-layered printed wiring board.

Obviously, numerous modifications and variations of the present invention are possible in light of the above teachings. It is therefore to be understood that, within the scope of the appended claims, the invention may be practiced otherwise than as specifically described herein.

All patents and other references mentioned above are incorporated in full herein by this reference, the same as if set forth at length.

The invention claimed is:

1. An adhesive film, comprising:
   (A) a layer of a resin composition, comprising:
      (a) a polyamide-imide resin which is soluble in organic solvents;
      (b) a thermosetting resin;
      (c) a filler; and
      (d) a resin having a polybutadiene structure and/or a polysiloxane structure,
   wherein:
      said polyamide-imide resin (a) and said thermosetting resin (b) are present in a weight ratio of said polymide-imide resin (a) to said thermosetting resin (b) of from 100:1 to 5:3;
      said polyimide-imide resin (a), said thermosetting resin (b), and said filler (c) are present in relative amounts such that weight ratio of the total amount of said polyamide-imide resin (a) and said thermosetting resin (b) to said filler (c) by weight is from 100:1 to 3:2;
      said resin having a polybutadiene structure and/or a polysiloxane structure (d) is present in an amount of 0.1 to 15 parts by weight based on 100 parts by weight of said polyamide-imide resin (a); and
      said polyamide-imide resin (a), said thermosetting resin (b), said filler (c), and said resin having a polybutadiene structure and/or a polysiloxane structure (d) are present in a total amount of not less than 90% by weight, based on the total weight of said resin composition,
   (B) a layer of a thermosetting resin composition which is solid at a temperature of 40° C. or lower and melts at a temperature of 140° C. or lower; and
   (C) a supporting film,
   and having a layer structure in the order of said supporting film (C), said layer of said resin composition (A), and said layer of said thermosetting resin composition (B).

2. The adhesive film according to claim 1, wherein said layer of a resin composition (A) further comprises:
   (e) a heat-resistant resin which is soluble in organic solvents, which is one or more heat-resistant resins selected from the group consisting of a polyimide resin, a polyamide resin, copolymers thereof, and mixtures thereof.

3. The adhesive film according to claim 1, wherein said layer of a resin composition (A) further comprises:
   (e) a heat-resistant resin which is soluble in organic solvents, which is one or more heat-resistant resins selected from the group consisting of a polyimide resin, a polyamide resin, a polyether imide resin, a polybenzoxazol resin, a polybenzimidazole resin, copolymers thereof, and mixtures thereof.

4. The adhesive film according to claim 1, wherein said polyamide-imide resin which is soluble in organic solvents (a) exhibits a tensile strength of not less than 100 MPa, an elongation at break of not less than 10%, a thermal expansion coefficient between 20 and 150° C. of not more than 60 ppm, and a glass transition temperature of not lower than 160° C.

5. The adhesive film according to claim 1, wherein said thermosetting resin (b) is one or more thermosetting resins selected from the group consisting of an epoxy resin having two or more epoxy groups in a molecule, a polymer of a bismaleimide compound with a diamine compound, a cyanate ester compound, and mixtures thereof.

6. The adhesive film according to claim 1, wherein said thermosetting resin (b) is an epoxy resin having two or more epoxy groups in a molecule.

7. The adhesive film according to claim 1, wherein said filler is one or more fillers selected from the group consisting of acrylic rubber particles, silicon particles, silica, and mixtures thereof.

8. The adhesive film according to claim 1, wherein said layer of said thermosetting resin composition (B) comprises a thermosetting resin composition which has a melt viscosity measured at a measurement starting temperature of 60° C., a temperature increasing rate of 5° C. per minute, and a frequency of 1 Hz/deg, of from 4,000 to 50,000 poise at 90° C., from 2,000 to 21,000 poise at 100° C., from 900 to 12,000 poise at 110° C., from 500 to 9,000 poise at 120° C., and from 300 to 15,000 poise at 130° C.

9. The adhesive film according to claim 1, wherein said layer of said thermosetting resin composition (B) is protected by a protective film.

10. The adhesive film according to claim 1, wherein said layer of said resin composition (A) has a thickness of 5 to 40 μm, said layer of said thermosetting resin composition (B) has a thickness of 10 to 100 μm, and said supporting film (C) has a thickness of 10 to 150 μm.

11. A method for making a multi-layered printed wiring board, comprising:
   (1) laminating an adhesive film according to claim 1 on one side or both sides of a circuit substrate, to obtain a laminated circuit substrate;
   (2) subjecting said laminated circuit substrate to a thermosetting treatment to obtain a circuit substrate with an insulation layer;

(3) drilling said circuit substrate with an insulation layer;
(4) removing said supporting film after said laminating (1), said subjecting (2) or said drilling (3);
(5) roughening a surface of said insulation layer with an oxidizing agent, to obtain a roughened surface;
(6) forming a conductive layer said on said roughened surface layer by metal plating; and
(7) forming a circuit on said conductive layer.

12. A multi-layered printed wiring board made by the method of claim 11.

13. A method for making a multi-layered printed wiring board according to claim 11, wherein said laminating said adhesive film is carried out with a vacuum laminator.

14. A method for making a multi-layered printed wiring board according to claim 11, wherein said supporting film is removed after said laminating (1).

15. A method for making a multi-layered printed wiring board according to claim 11, wherein said supporting film is removed after said subjecting (2).

16. A method for making a multi-layered printed wiring board according to claim 14, wherein said supporting film is removed after said drilling (3).

* * * * *